United States Patent [19]

Nakamura

[11] Patent Number: 4,939,064
[45] Date of Patent: Jul. 3, 1990

[54] LIGHT-SENSITIVE MATERIAL CONTAINING SILVER HALIDE, REDUCING AGENT, POLYMERIZABLE COMPOUND AND BASE PRECURSOR COMPOUND

[75] Inventor: Taku Nakamura, Kanagawa, Japan
[73] Assignee: Fuji Photo Film Co., Ltd., Kanagawa, Japan
[21] Appl. No.: 225,456
[22] Filed: Jul. 28, 1988
[30] Foreign Application Priority Data
  Jul. 28, 1987 [JP] Japan .................. 62-188580
[51] Int. Cl.$^5$ .................. G03C 1/68; G03C 1/72
[52] U.S. Cl. .................. 430/138; 430/281; 430/617; 430/619; 430/755
[58] Field of Search .............. 430/128, 281, 619, 955, 430/617

[56] References Cited

U.S. PATENT DOCUMENTS

| | | | |
|---|---|---|---|
| 4,499,172 | 2/1985 | Hirai et al. | 430/203 |
| 4,629,676 | 12/1986 | Hayakawa et al. | 430/203 |
| 4,649,104 | 3/1987 | Nakamura et al. | 430/607 |
| 4,650,749 | 3/1987 | Sato et al. | 430/617 |
| 4,696,887 | 9/1987 | Sato et al. | 430/203 |
| 4,705,737 | 11/1987 | Hirai et al. | 430/203 |
| 4,716,100 | 12/1987 | Yabuki et al. | 430/570 |
| 4,731,321 | 3/1988 | Sato et al. | 430/559 |
| 4,758,496 | 7/1988 | Kakimi | 430/138 |
| 4,760,011 | 7/1988 | Kakimi | 430/138 |
| 4,761,361 | 8/1988 | Ozaki et al. | 430/619 |

FOREIGN PATENT DOCUMENTS

203613 12/1986 European Pat. Off. .

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprises a support and a light-sensitive layer containing silver halide, a reducing agent, an ethylenic unsaturated polymerizable compound and a base precursor in the form of a salt of an organic base with a carboxylic acid. The silver halide, reducing agent, polymerizable compound and base precursor are contained in microcapsules which are dispersed in the light-sensitive layer. The organic base of the base precursor is a diacidic to tetraacidic base which is composed of two to four amidine moieties and at least one linking group for the amidine moieties. The linking group is a residue of a hydrocarbon or a heterocyclic ring. The amidine moiety corresponds to an atomic group formed by removing one or two hydrogen atoms from an amidine having the following formula (I):

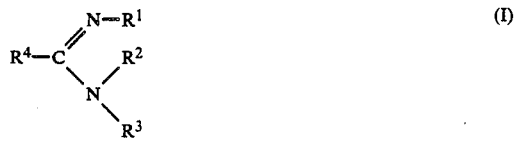

wherein each of $R^1$, $R^2$, $R^3$ and $R^4$ independently is hydrogen, an alkyl group, an alkenyl group, an alkynyl group, a cycloalkyl group, an aralkyl group, an aryl group or a heterocyclic group, and any two of $R^1$, $R^2$, $R^3$ and $R^4$ may be combined together to form a five-membered or six-membered heterocyclic ring consisting of nitrogen and carbon atoms.

15 Claims, No Drawings

LIGHT-SENSITIVE MATERIAL CONTAINING SILVER HALIDE, REDUCING AGENT, POLYMERIZABLE COMPOUND AND BASE PRECURSOR COMPOUND

FIELD OF THE INVENTION

This invention relates to a light-sensitive material which comprises a support and a light-sensitive layer containing silver halide, a reducing agent and a polymerizable compound.

BACKGROUND OF THE INVENTION

A light-sensitive material which comprises a support and a light-sensitive layer containing silver halide, a reducing agent and a polymerizable compound can be used in an image forming method in which a latent image of silver halide is formed, and then the polymerizable compound is polymerized to form the corresponding image.

Examples of said image forming methods are described in Japanese Patent Publication Nos. 45(1970)–11149 (corresponding to U.S. Pat. No. 3,697,275), 47(1972)–20741 (corresponding to U.S. Pat. No. 3,687,667) and 49(1974)–10697, and Japanese Patent Provisional Publication Nos. 57(1982)–13862, 57(1982)–142638, 57(1982)176033, 57(1982)–211146 (corresponding to U.S. Pat. No. 4,557,997), 58(1983)–107529 (corresponding to U.S. Pat. No. 4,560,637), 58(1983)–121031 (corresponding to U.S. Pat. No. 4,547,450) and 58(1983)–169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publications Nos. 61(1986)–69062 and 61(1986)–73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

Japanese Patent Provisional Publication No. 61(1986)-275742 describes an embodiment of the light-sensitive material, in which the silver halide, reducing agent and polymerizable compound are contained in microcapsules which are dispersed in the light-sensitive layer. The light-sensitive material employing the microcapsules (referred to as "light-sensitive microcapsules" hereinafter) can give a clear image improved in sharpness.

The polymerization reaction in the above-mentioned image forming method smoothly proceeds under alkaline conditions. Therefore, a base or base precursor is preferably contained in the light-sensitive layer. Examples of the base and base precursor are described in Japanese Patent Provisional Publications No. 61(1986)69062, No. 61(1986)-73145 and 62(1987)-264041.

In order to accelerate the polymerization reaction using the base or base precursor, the base or base precursor is preferably contained in light-sensitive microcapsules. However, if the base is contained in the light-sensitive microcapsules, the sensitivity of the light-sensitive material tends to decrease or the material tends to be fogged in the course of the storage. Japanese Patent Provisional Publication No. 62(1987)264041 discloses various base precursors. However, the base precursor is not stable during storage, or is not quickly decomposed to form a base when it is heated.

Further, there has been scarecely found a base precursor which is stable for a reaction condition (especially, reaction temperature ususaly in the range of 30° to 80° C.) in preparation of the shell of the lightsensitive microcapsules and quickly forms a base in a heat development process (heating temperature is ususally in the range of 80° to 200° C., which is generally 50° to 120° C. higher than the reaction temperature).

Therefore, the base or base precursor has been arranged outside of light-sensitive microcapsules in the light-sensitive layer as described in Japanese Patent Provisional Publication No. 62(1987)-209523. The base or base precursor permeates the light-sensitive microcapsules in a heat development process.

SUMMARY OF THE INVENTION

An object of the present invention is to provide a light-sensitive material which is stable during storage and gives a clear image.

There is provided by the present invention a lightsensitive material comprising a support and a light-sensitive layer containing silver halide, a reducing agent, an ethylenic unsaturated polymerizable compound and a base precursor in the form of a salt of an organic base with a carboxylic acid, said silver halide, reducing agent and polymerizable compound being contained in microcapsules which are dispersed in the light-sensitive layer, wherein the base precursor is contained in the microcapsules, and the organic base of the base precursor is a diacidic to tetraacidic base which is composed of two to four amidine moieties and at least one residue of a hydrocarbon or a heterocyclic ring as a linking group for the amidine moieties, said amidine moiety corresponding to an atomic group formed by removing one or two hydrogen atoms from an amidine having the following formula (I):

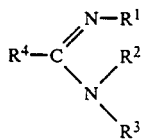

wherein each of $R^1$, $R^2$, $R^3$ and $R^4$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^1$, $R^2$, $R^3$ and $R^4$ may be combined together to form a five-membered or six-membered heterocyclic ring consisting of nitrogen and carbon atoms.

The light-sensitive material of the present invention is characterized in that the salt of the abovementioned oganic base with a carboxylic acid is used as the base precursor, and the base precursor is contained in the light-sensitive microcapsules.

The present inventor has found that the above-mentioned base precursor is very stable at the temperature during storage (i.e., room temperature) and at the reaction temperature for preparation of the shell of the microcapsules, and that the base precursor rapidly releases a base at an elevated temperature (i.e., the heating temperature of the heat development process) This supprising effect is explained below.

The salt composed of a diacidic, triacidic or tetraacidic base with a carboxylic acid has a stable crystal structure, compared with a salt wherein the organic base is a monoacidic base. Particularly, when the diacidic to tetraacidic base has a symmetrical structure, the crystal structure is highly stable.

Further, a functional group accelerating decarboxylation such as an aryl group is often introduced into the carboxylic acid of the base precursor. Consequently, the carboxylic acid generally has a hydrophobic residue. In a salt composed of the carboxylic acid having a hydrophobic residue and the diacidic to tetraacidic base, a plurality of the hydrophobic residue in the carboxylic acid are positioned around the organic base through ionic bonds. Accordingly, the base is located in the center of the salt surrounded by the hydrophobic residues of the carboxylic acid. The above-mentioned structure is much stable as compared with the structure of a salt wherein the organic base is a monoacidic base, where the organic base and the hydrophobic residue of the carboxylic acid are positioned at both ends of the structure through ionic bond.

The present inventor has found that the base precursor composed of a carboxylic acid and an organic base melts or is dissolved in components contained in light-sensitive microcapsules at an elevated temperature and then the decarboxylation of the carboxylic acid is initiated. The base precursor has a stable crystal structure as mentioned above. Accordingly, the crystal structure of the base precursor is kept until it melts or is dissolved at an elevated temperature. Therefore, the carboxylic acid is rapidly decarboxylated to release a base at the same time that the crystal structure is broken.

When the carboxylic acid has an hydrophobic residue, the carboxyl group of the carboxylic acid and the organic base are blocked by the hydrophobic residue in the base precursor of the present invention. Accordingly, the crystal structure of the salt is further stabilized by intermolecular interaction between the hydrophobic residues. Therefore, the base precursor employed for the light-sensitive material of the present invention exhibits much higher stability during storage when the carboxylic acid has the hydrophobic residues.

The diacidic to tetraacidic base derived from an amidine having the formula (I) is used as the organic base in the base precursor. Accordingly, the base precursor releases the amidine derivative, which is a strong base, so that the relased base strongly functions in the development process.

Since the base precursor has the above-mentioned excellent characteristics, it is possible to incorporate the base precursor into the light-sensitive microcapsules. The base precursor has a relatively distinct decomposition point (i.e.. the temperature required to form a base). Therefore, the behavior of the base precursor with respect to the base forming reaction can be varied within a relatively narrow difference in temperature (i.e., the diferrence between the reaction temperature for preparation of the shell of the microcapsules and the heating temperature of the heat development process).

In the light-sensitive material of the present invention, the base precursor is incorporated into the light-sensitive microcapsules. Therefore, a base, which is formed from the base precursor in the heat development process, immediately acts on the components of the microcapsules as an image formation accelerator.

As a result, the light-sensitive material of the invention can give a clear image having a high sensitivity, even after the light-sensitive material is stored for a long time or under severe conditions.

DETAILED DESCRIPTION OF THE INVENTION

The base precursor employed for the light-sensitive material of the present invention is in the form of a salt of an organic base with a carboxylic acid. The organic base has two, three or four amidine moieties in its molecular structure. The amidine moiety corresponds to an atomic group formed by removing one or two hydrogen atoms from an amidine having the following formula (I):

In the formula (I), each of $R^1$, $R^2$, $R^3$ and $R^4$ independently is a monovalent group such as hydrogen, an alkyl group, an alkenyl group, an alkynyl group, a cycloalkyl group, an aralkyl group, an aryl group and a heterocyclic group. Each of the monovalent groups may have one or more substituent groups. Among them, hydrogen, an alkyl group, a cycloalkyl group, an aralkyl group and an aryl group are preferred. Each of the alkyl group, the alkenyl group and the alkynyl group preferably has 1 to 6 carbon atoms. An example of the cycloalkyl group is cyclohexyl. An example of the aralkyl group is benzyl. An example of the aryl group is phenyl.

Any two of $R^1$, $R^2$, $R^3$ and $R^4$ may be combined together to form a five-membered or six-membered heterocyclic ring consisting of nitrogen and carbon atoms (the five or six members of the ring are only nitrogen and carbon atoms). It is particularly preferred that $R^1$ and $R^2$ are combined together to form a cyclic amidine having the following formula (I-2):

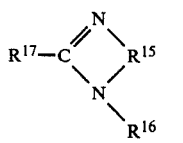 (I-2)

In the formula (I-2), $R^{15}$ is a divalent group such as ethylene, propylene, vinylene and propenylene. Each of the divalent groups may have one or more substituent groups. Among them, ethylene and propylene are preferred, and propylene is most preferred. In other words, the cyclic amidine having the formula (I-2) preferably is 2-imidazoline, 1,4 5,6-tetrahydropyrimidine or a derivative thereof, and more preferably is 1,4,5,6-tetrahydropyrimidine or derivatives thereof.

$R^{16}$ has the same meaning as in $R^3$ of the formula (I). It is particularly preferred that $R^{16}$ is hydrogen or an alkyl group.

$R^{17}$ has the same meaning as in $R^4$ of the formula (I). It is particularly preferred that $R^{17}$ is hydrogen.

Another heterocyclic ring, aliphatic ring (e.g., cyclohexane) and/or aromatic ring may be condensed with the cyclic amidine having the formula (I-2).

In the present invention, the organic base of the base precursor is a diacidic to tetraacidic base which is composed of two to four amidine moieties corresponding to an atomic group formed by removing one or two hydrogen atoms from the above-mentioned amidine and at least one linking group for the amidine moieties. The linking group is a residue of a hydrocarbon or a heterocyclic ring. The linking group may have one or more substituent groups.

The amidine moiety preferably is a monovalent substituent group of a hydrocarbon or heterocyclic ring, as shown in the formula (II) given below. In other words, it is preferred that the amidine moiety corresponds to an atomic group formed by removing one hydrogen atom from an amidine having the formula (I). However, the amidine moiety may correspond to an atomic group formed by removing two hydrogen atoms from an amidine having the formula (I). In this case, the organic base may be in the form of a condensed heterocyclic ring (e.g., a tricyclic condensed ring).

In the base precursor employed for the light-sensitive material of the present invention, the diacidic to tetraacidic base preferably has the following formula (II).

$$R^5(-B)_n \quad \text{(II)}$$

In the formula (II), $R^5$ is an n-valent residue of a hydrocarbon or heterocyclic ring. The "n" is an integer of 2 to 4. The "n" preferably is 2 or 4, and more preferably is 2. When the "n" is 2, it is preferred that the divalent residue of the hydrocarbon, which may constitute $R^5$, is an alkylene group (more preferably having 1 to 6 carbon atoms) or an arylene group (more preferably, phenyl). An example of the residue of the heterocyclic ring, which may constitute $R^5$, is a residue derived from pyridine ring.

The diacidic to tetraacidic base having the formula (II) preferably is symmetrical. In the present specification, the term of "symmetrical organic base" means that all of the groups represented by "B" are equivalent in the molecular structure of the organic base. In concrete expression, it means that no isomer is formed, even if the groups represented by "B" are replaced by different groups.

In the formula (II), the group represented by "B" is a monovalent group corresponding to an atomic group formed by removing one hydrogen atom from an amidine having the formula (I).

There is no specific limitation with respect to the position of hydrogen atom to be removed. However, when $R^4$ in the formula (I) is hydrogen, the hydrogen atom corresponding to $R^4$ is preferably removed. In other words, it is particularly preferred that the organic base represented by the formula (II) is a diacidic to tetraacidic base having the following formula (II-1):

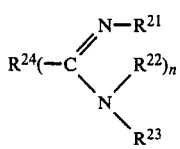 (II-1)

In the formula (II-1), $R^{21}$, $R^{22}$ and have the same meanings as in $R^1$, $R^2$ and $R^3$ of the formula (I). $R^{24}$ and "n" have the same meanings as in $R^5$ and "n" of the formula (II), respectively.

Any two of $R^{21}$, $R^{22}$ and $R^{23}$ may be combined together to form a a five-membered or six-membered heterocyclic ring consisting of nitrogen and carbon atoms. It is particularly preferred that $R^{21}$ and $R^{22}$ are combined together to form a diacidic to tetraacidic base having the following formula (II-2):

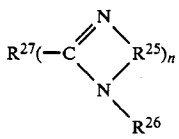 (II-2)

In the formula (II-2), $R^{25}$ and $R^{26}$ have the same meanings as in $R^{15}$ and $R^{16}$ of the formula (I-2), respectively. $R^{27}$ and "n" have the same meanings as in $R^5$ and "n" of the formula (II), respectively.

Examples of the organic base which can be used in the base precursor are given below.

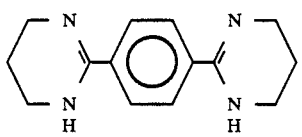 (B-1)

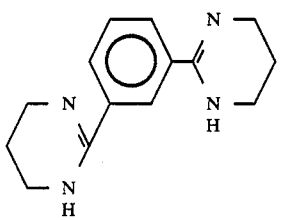 (B-2)

-continued
(B-3) 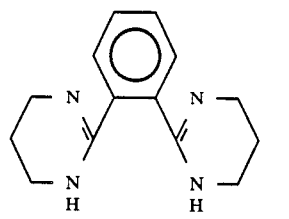
(B-4) 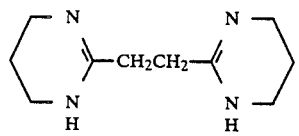
(B-5) 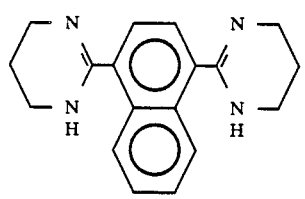
(B-6) 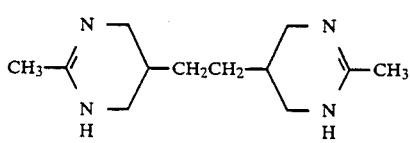
(B-7) 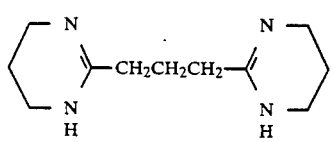
(B-8) 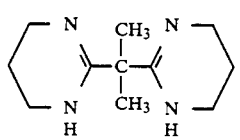
(B-9) 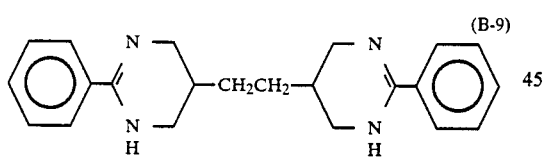
(B-10) 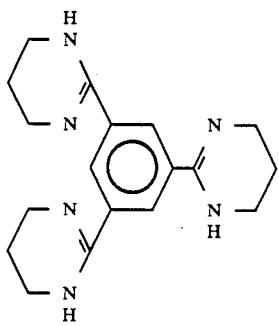
(B-11) 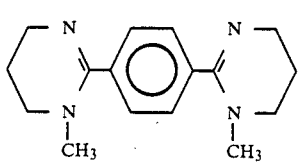
-continued
(B-12) 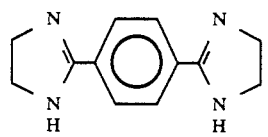
(B-13) 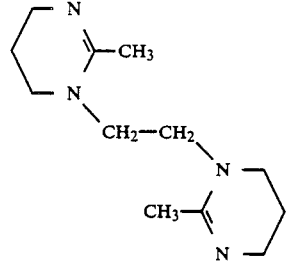
(B-14) 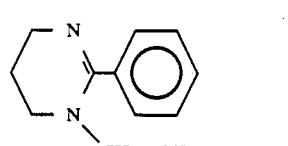
(B-15) 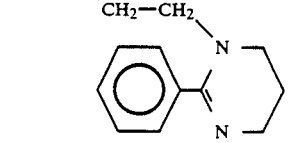
(B-16) 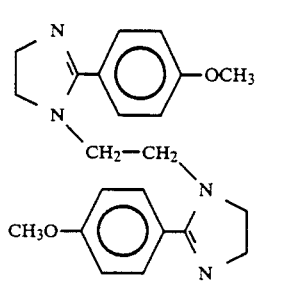
(B-17) 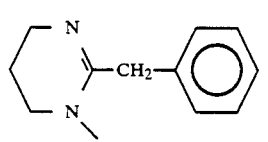
(B-18) 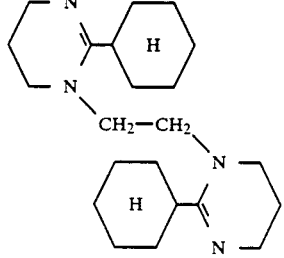

-continued

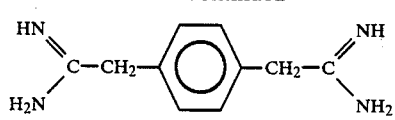 (B-19)

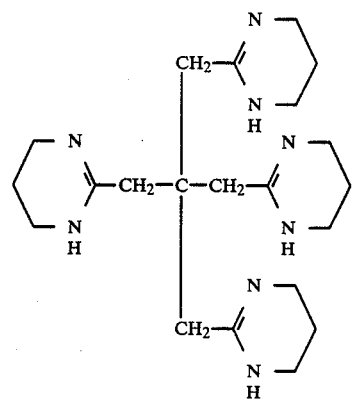 (B-20)

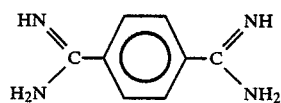 (B-21)

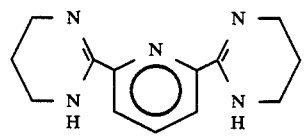 (B-22)

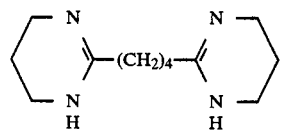 (B-23)

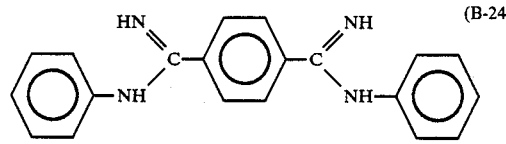 (B-24)

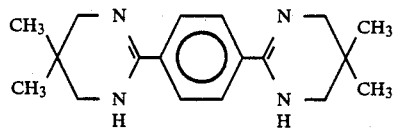 (B-25)

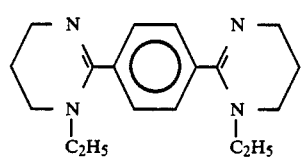 (B-26)

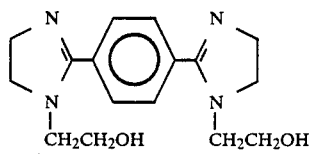 (B-27)

-continued

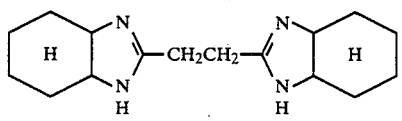 (B-28)

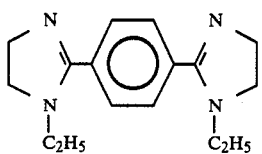 (B-29)

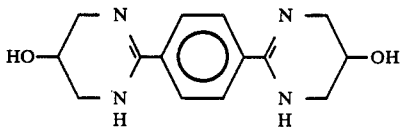 (B-30)

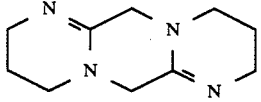 (B-31)

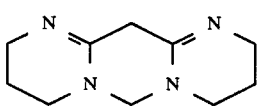 (B-32)

The carboxylic acid of the base precursor should have such a property that the carboxyl group undergoes decarboxylation under certain conditions. However, carboxyl group generally has the above-described property so that various kinds of carboxylic acids can be used in the base precursor.

In the case that the light-sensitive material of the present invention containing the base precursor is used for a heat development process, it is preferred that the carboxyl group undergoes decarboxylation at an elevated temperature. The heating temperature required to decarboxylate the carboxyl group preferably is in the range of 80° to 250° C., and more preferably is in the range of 110° to 200° C.

Examples of the carboxylic acids having the above-mentioned property include trichloroacetic acid, propiolic acid and sulfonylacetic acid, which are described in the publications mentioned in the present specification at page 3. It is preferred that the carboxylic acid has a a functional group accelerating decarboxylation such as an aryl group or an arylene group, as mentioned above. The carboxylic acid preferably is a sulfonylacetic acid having the following formula (III-1) or a propiolic acid having the following formula (III-2).

 (III-1)

In the formula (III-1), each of $R^{31}$ and $R^{32}$ is a monovalent group such as hydrogen, an alkyl group, an alkenyl group, a cycloalkyl group, an aralkyl group, an aryl group and a heterocyclic group. Each of the monovalent groups may have one or more substituent groups. Among them, hydrogen, an alkyl group and an aryl group are preferred. Each of the alkyl group, the alkenyl group and the alkynyl group preferably has 1 to 8 carbon atoms.

In the formula (III-1), "k" is 1 or 2. When "k" is 1, Y is a monovalent group such as an alkyl group, a cycloalkyl group, an alkenyl group, an alkynyl group, an aralkyl group, an aryl group and a heterocyclic group. Among them, an aryl group and a heterocyclic group are preferred, and an aryl group is particularly preferred. Each of the monovalent groups may have one or more substituent groups. Examples of the substituent group of the aryl group include a halogen atom, an alkyl group, an alkoxyl group, an alkylsulfonyl group, an arylsulfonyl group, an acylamino group, carbamoyl and sulfamoyl.

When "k" is 2, Y is a divalent group such as an alkylene group, an arylene group and a heterocyclic group. Each of the divalent groups may have one or more substituent groups. Among them, an arylene group and a heterocyclic group are preferred, and an arylene group is particularly preferred. Examples of the substituent groups of the arylene group are the same as those of the aryl group mentioned above.

$$Z(-C \equiv C - CO_2H)_m \qquad (III-2)$$

In the formula (III-2), "m" is 1 or 2. When "m" is 1, Z is a monovalent group such as hydrogen, an alkyl group, a cycloalkyl group, an alkenyl group, an alkynyl group, an aralkyl, an aryl group, a heterocyclic group and carboxyl. Each of the monovalent groups may have one or more substituent groups. The aryl group is particularly preferred.

When "m" is 2, Z is a divalent group such as an alkylene group, an arylene group and a heterocyclic group. Each of the divalent groups may have one or more substituent groups. The arylene group is particularly preferred.

Examples of the carboxylic acid are given below.

(A-1)

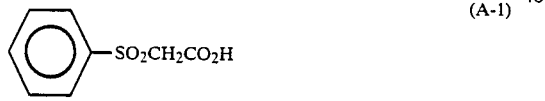
(A-2)

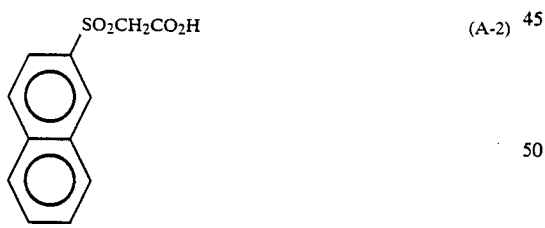
(A-3)

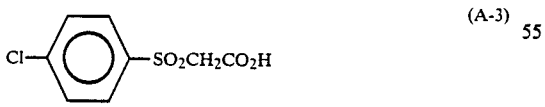
(A-4)

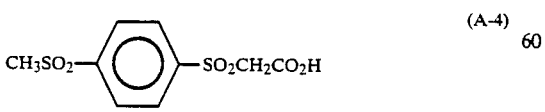
(A-5)

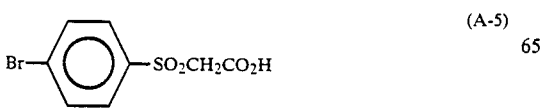
(A-6)

(A-7)

(A-8)

(A-9)

(A-10)

(A-11)

(A-12)

(A-13)

(A-14)

(A-15)

-continued (A-16) 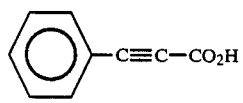

(A-17) 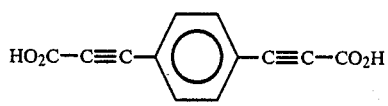

(A-18) 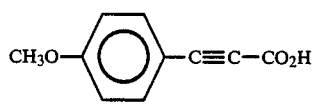

(A-19) 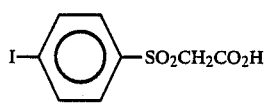

(A-20) 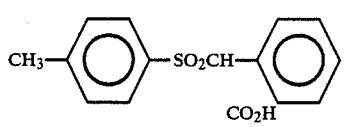

(A-21) 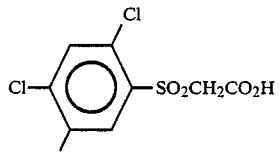

(A-22) 

The base precursor is in the form a salt composed of the above-mentioned carboxylic acid and organic base. There is no specific limitation with respect to a combination of the carboxylic acid and the organic base. However, it is preferred that the salt of the carboxylic acid and the organic base has a melting point of 50° to 200° C., more preferably 80° to 120° C.

Concrete examples of the base precursor of the present invention are described below. However, the present invention is not limited to the following examples.

(1)
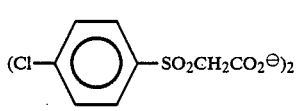
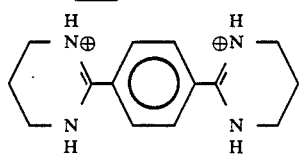

(2)
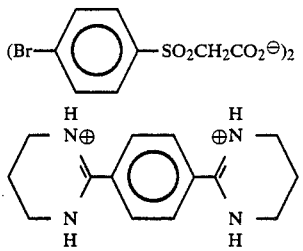

(3)
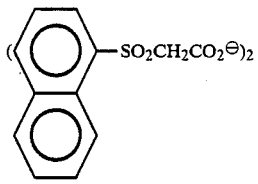
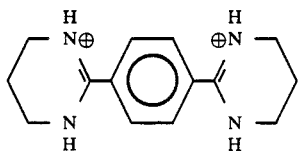

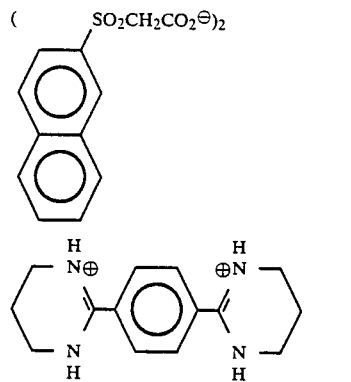
(4)
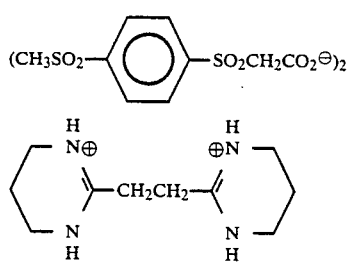
(5)
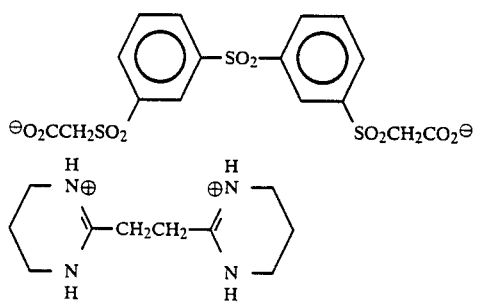
(6)
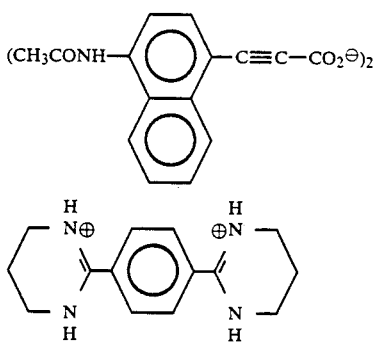
(7)
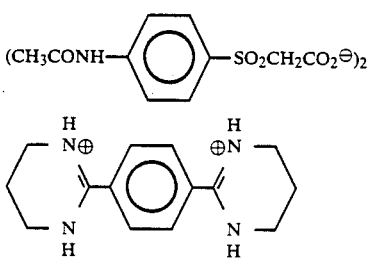
(8)

-continued
(9)
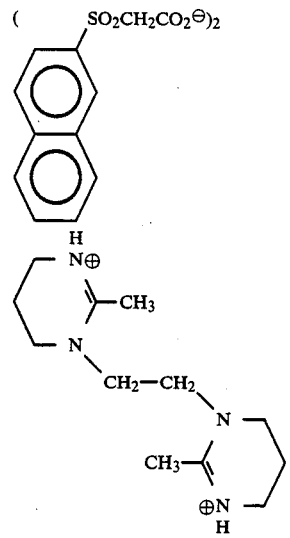
(10)
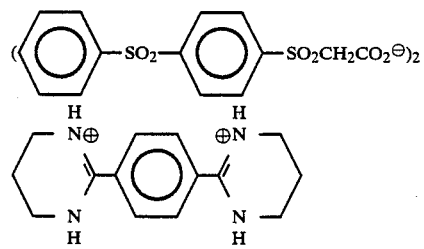
(11)
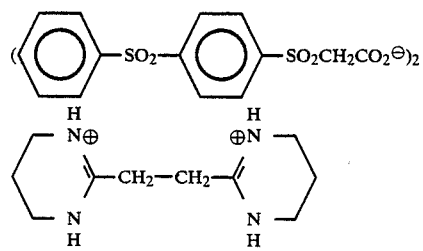
(12)
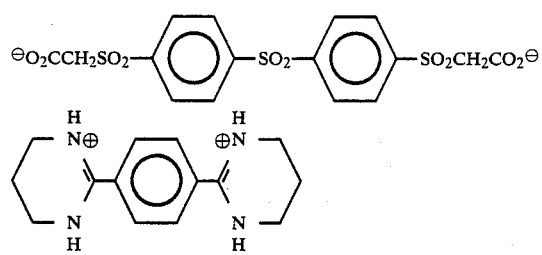
(13)
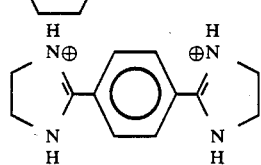

-continued
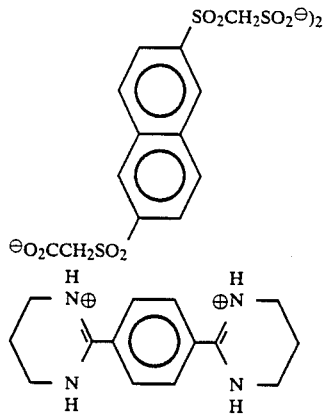 (14)
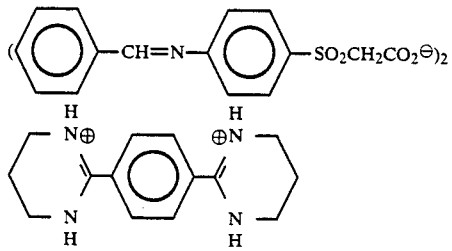 (15)
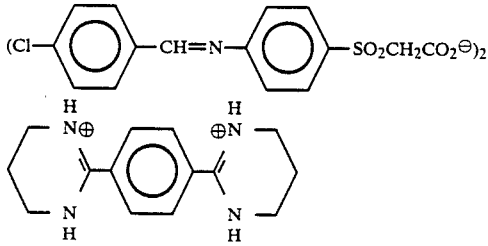 (16)
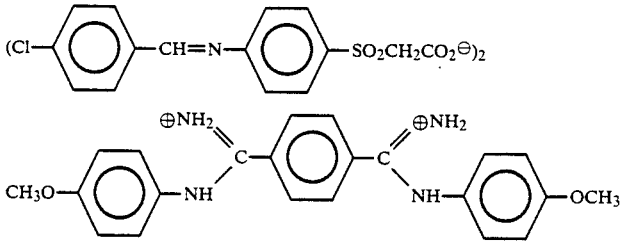 (17)
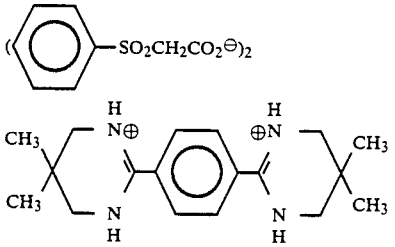 (18)
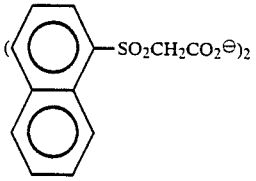 (19)

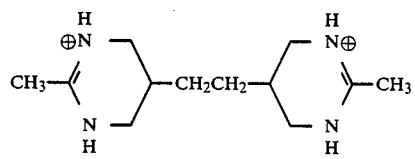
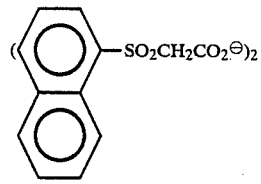
(20)
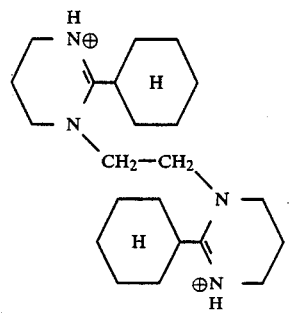
(21)
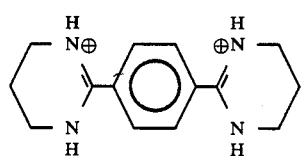
(22)
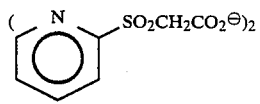
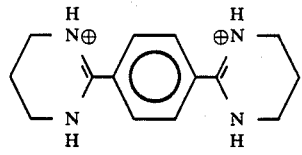
(23)
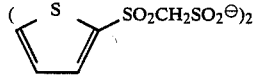
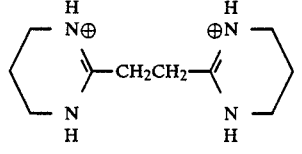
(24)

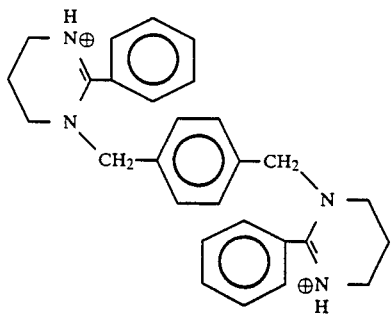

(25)

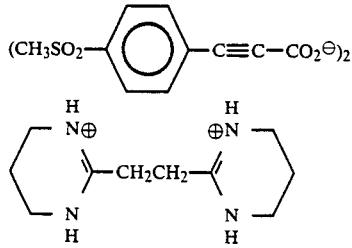

(26)

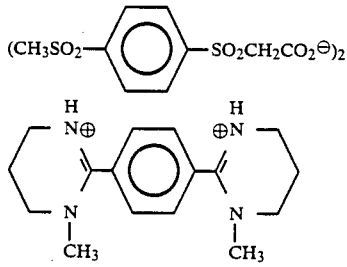

(27)

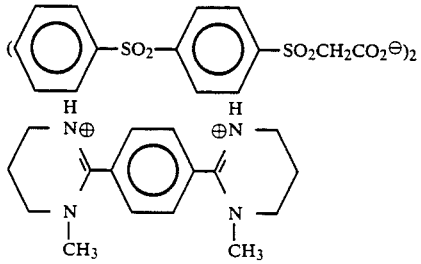

(28)

Synthesis Examples of the base precursors (3) and (5) are described hereinafter. The other base precursors can be synthesized in a similar manner as in the Synthesis Examples.

SYNTHESIS EXAMPLE 1

Synthesis of 1-naphthalenesulfonyl chloride

In a mixed solution of 260 ml of acetonitrile and 7 ml of dimethylacetamide was suspended 133 g of sodium α-naphthalenesulfonate. While cooling the suspension with water, 80 ml of phosphorus oxychloride was dropwise added to the suspension. After the addition, the mixture was reacted at 65° C. for one hour. The reaction mixture was cooled and poured into 2 l of ice-cold water. The precipitated grayish-white crystals were recovered by filtration and air-dried. The yield was 110.8 g (84.6% of theoretical value), m.p. 66°–68° C.

Synthesis of 1-naphthalenesulfinic acid

To 500 ml of an aqueous solution of 122 g of sodium sulfite was added 110 g of α-naphthalenesulfonyl chloride. While cooling the mixture with water, 20% aqueous solution of 36 g of sodium hydroxide was dropwise added to the mixture so as to keep the reaction mixture at a pH of about 8. After about one hour, the reaction mixture became uniform. To the mixture was added 135 ml of 35% hydrochloric acid was dropwise added. The formed grayish-white crystals were recovered by filtration and air-dried. The yield was 91.4 g (98% of theoretical value).

Synthesis of 1-naphthylsulfonylacetic acid (A-9)

In 45 ml of isopropyl alcohol were suspended 44 g of 1-naphthalenesulfinic acid, 17.4 g of potassium carbonate and 34.4 g of isopropyl chloroacetate. The suspension was heated to reflux for three hours. The reaction mixture was cooled, and 20% aqueous solution of 13.8 g of sodium hydroxide was added to the mixture. The mixture was stirred for one hour. The resulting solution was diluted with 58 ml of water. To the solution was added 58 ml of hydrochloric acid. The precipitated crystals were recovered by filtration and air-dried. The yield was 54.9 g (95.8% of theoretical value).

The crude crystals were recrystallized from 165 ml of acetonitrile to purify it. The yield was 44 g, m.p. 168°–172° C.

Synthesis of organic base (B-1)

In 600 ml of toluene were suspended 384 g of terephthalonitrile, 533 g of 1,3-diaminopropane and 0.9 g of sulfur. The suspension was heated to reflux for 12 hours and then cooled to 70° C. To the reaction mixture was added 300 ml of methanol. The mixture was cooled to room temperature. The precipitated crystals were recovered by filtration and dried. The yield was 706.5 g (97.3% of theoretical value).

The crude crystals were recrystallized from 3 l of methanol. The yield was 567 g (78% of theoretical value), m.p. 313° C.

Synthesis of base precursor (3)

A solution of 41.2 g of 1-naphthylsulfonylacetic acid (A-9) in 120 ml of methanol was added to a suspension of 19.3 g of the organic base (B-1) in 160 ml of methanol. The crystals precipitated from the resulting uniform solution were recovered by filtration and airdried. The yield was 55.0 g (92.7% of theoretical value).

SYNTHESIS EXAMPLE 2

Synthesis of organic base (B-4)

A solution of 40 g of succinonitrile, 100 ml of 1,3-diaminopropane and 0.3 g of sulfur in 60 ml of toluene was heated to reflux for three hours and then cooled to room temperature. The precipitated crystals were recovered by filtration, washed with acetonitrile and dried. The yield was 95 g (98% of theoretical value), m.p. 218° C.

Synthesis of base precursor (5)

A solution of 11.6 g of the organic base (B-4) in 20 ml of methanol was added to a suspension of 36 g of p-methylsulfonylphenylsulfonylacetic acid (A-4) in 150 ml of methanol. The mixture was stirred for one hour and the formed crystals were recovered by filtration. The yield was 44.6 g (99% of theoretical value).

In the light-sensitive material of the present invention, the above-mentioned base precursor is contained in light-sensitive microcapsules (which is described hereinafter).

In the light-sensitive material of the invention, the base precursor is preferably contained in the lightsensitive layer in the amount of not more than 50 weight % based on the total amount of the light-sensitive layer, and more preferably is contained in the range of from 0.01 to 40 weight %. Two or more base precursors can be used in the combination.

The base precursor is preferably dispersed in the light-sensitive microcapsule in the form of solid particles. The base precursor can be added in any stages of the preparation of the light-sensitive microcapsule.

The light-sensitive microcapsules containing silver halide and the polymerizable compound, the reducing agent and the support which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)154232, 58(1983)-108533, 59(1984)-48755 and 59(1984)52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m. more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m², more preferably in the range of from 1 mg to 90 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. For example, when hydrazines are used as the reducing agent, the polymerizable compound within the area where the latent image has been formed is polymerized. Further, when 1-phenyl-3-pyrazolidone is used as the reducing agent, the polymerizable compound within the area where the latent image has not been formed is polymerized, .

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-(4-(2,5-di-tert-pentylphenoxy)butyloyl}-2-(p-or o- methoxyphenyl)hydrazine, 1-(methoxycarbonylbenzohydryl)2-phenylhydrazine, 1-formyl-2-[4-{2-(2,4-di-tert-pentylphenoxy) butylamide} phenyl]hydrazine, 1-acetyl-2-[4-{2(2,4-di-tert-pentylphenoxy)butylamido}phenyl]hydrazine, 1-trityl-2-[{2,6-dichloro-4-(N,N-di-2-ethylhexyl)carbamoyl} phenyl]hydrazine, 1-(methoxycarbonylbenzohydryl)-2(2,4-dichlorophenyl)hydrazine, 1-trityl-2-[{2-(N-ethyl-N-octylsulfamoyl)-4-methanesulfonyl}phenyl]hydrazine, 1benzoyl-2-tritylhydrazine, 1-(4-butoxybenzoyl)-2-trityl-hydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenic unsaturated group. Any known ethylenic unsaturated polymerizable compounds including monomers, oligomers and polymers can be contained in the light-sensitive layer. In the image-forming method of the invention, a polymerizable compounds having a relatively higher boiling point (e.g., 80° C. or higher) is prebarably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Examples of compounds having an ethylenic unsaturated group include acrylic acid, salts of acrylic acid, acrylic esters. acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include nbutyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A. The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

In the light-sensitive material of the invention, the base precursor, silver halide, reducing agent and polymerizable compound are contained in microcapsules to form light-sensitive microcapsules which are dispersed in the light-sensitive layer. There is no specific limitation with respect to a process for the preparation of microcapsules, and the various known processes can be employed.

These is also no specific limitation on shell material of the microcapsules, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin comprising polyamide resin and polyurea resin, and a complex resin comprising polyurethane resin and polyester resin.

In the case that the shell material is composed of a condensed aldehyde resin, the residual aldehyde preferably is not more than 5 mole based on 1 mole of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive material can be prepared by arranging a light-sensitive layer containing the abovementioned components on a support. There is no limitation with respect to the support. In the case that a heat development is unilized in the use of the lightsensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m² which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15 % both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm² at pressure of 567 g. Furthermore, a paper support preferably has a pH value in the range of 5 to 9.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes having a property of being decolorized when it is heated or irradiated with light, matting agents, antismudging agents, plasticizers, water releasers, binders, photo polymerization initiator, solvent of the polymerizable compound and water soluble vinyl polymers.

The light-sensitive material containing the abovementioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigmentprecursor) which develops to give a color under application of external energy (e.g.. heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heatsensitive color formation by a chemical change) or in MSS. of the seminer promoted by the Society of Kinki Chemical Industry, "The Newest Chemistry of Coloring Matter - Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to about 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the lightsensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes hemicyanine dyes styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\alpha$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Examples of the radical generators include triazene-silver silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, compounds functioning as an antifogging agent and/or a development accelerator, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/jor $-CO-$group described in U.S. Pat. No. 3,347,675; polar compounds described in U.S. Pat. No. 3,667,959; and 1,10-decanediol, methyl anisate and biphenyl suberate described in Research Disclosure pp. 26-28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6$\neq$18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-200241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)280133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the light-sensitive microcapsule.

In the case that the water soluble vinyl polymer is is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the lightsensitive material to produce the desired image on the image-receiving layer of the light-sensitive material. The image-receiving layer of the light-sensitive material can be constructed in the same manner as the layer of the image-receiving material. The details of the imagereceiving layer will be described later.

Examples and usage of the other auxiliary layers are also described in the above-mentioned publications and applications concerning the light-sensitive material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304 a process of using isocyanate-polyol wall materials as described in U.S. Pat. No. 3,796,669; a process of using isocyanate wall materials as described in U.S. Pat. No. 3,914,511; a process of using ureaformaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

The light-sensitive material of the invention can be prepared by coating and drying the above-prepared coating solution on a support. The process for coating the coating solution on a support can be easily carried out in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths (sensitized wavelength when seinsitization is carried out) or sensitivity of silver halide. Original image can be either monochromatic image or color image.

Development of the light-sensitive material can be conducted simultaneously with or after the image exposure. The development can be conducted using a developing solution in the same manner as the image forming method described in Japanese Patent Publication No. 45(1970)-11149 The image forming method described in Japanese Patent Provisional Publication No. 61(1986)69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the lightsensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the lightsensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow.

Examples of the material employable as the support of the image-receiving material include baryta paper in addition to various examples which can be employed as the support of the known light-sensitive materia. In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing an image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the imagereceiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc is contained in the imagereceiving layer, the image-receiving layer can function as a white reflection layer. In this case, the white pigment is used in an amount of from 10 g to 100 g based on 1 g of the thermoplastic material.

The above-mentioned dye and pigment can be either uniformly or locally contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the imagereceiving material on the opposite side of the imagereceiving layer.

After the image exposure and/or the development process, pressing the light-sensitive material on the imagereceiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention thereto

EXAMPLE 1

Preparation of silver halide emulsion

In 1,200 ml of water were dissolved 25 g of gelatin and 3 g of sodium chloride, and the resulting gelatin solution was kept at 50° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting mixture was added 200 ml of an aqueous solution containing 4.3 g of potassium iodide at the same feed rate over 5 minutes.

After washing for desalting the emulsion, in the emulsion was dissolved 24 g of gelatin. To the resulting emulsion was added 5 mg of thiosulfate chloride, and then was chemical sensitized at 60° C. for 15 minutes to obtain a silver halide emulsion. Yield of the emulsion was 1,000 g.

Preparation of light-sensitive composition

In 100 g of trimethylolpropane triacrylate (Aronix M-309; tradename of Toa Gosei Chemical Industry Co., Ltd.) were dissolved 0.40 g of the following copolymer and 10.00 g of Pargascript Red I-6-B (tradename of CibaGeigy).

(Copolymer)

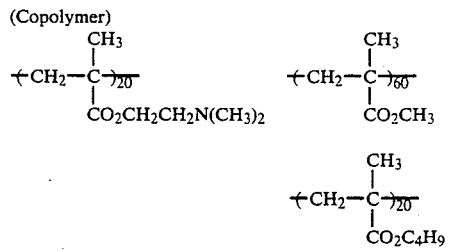

To the above solution was dispersed 33.3 g of the following base precursor (3) using Dynomill dispersing device.

(Base precursor (3))

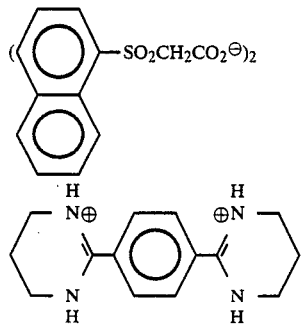

To 24.00 g of the dispersion were added 1.29 g of the following reducing agent (I), 1.22 g of the following reducing agent (II), 0.001 g of the following antifogging agent, 0.36 g of Emulex NP-B (tradename of Nippon Emulsion Co.. Ltd.) and 4.0 g of methylene chloride. The resulting mixture was made uniform.

(Reducing agent (I))

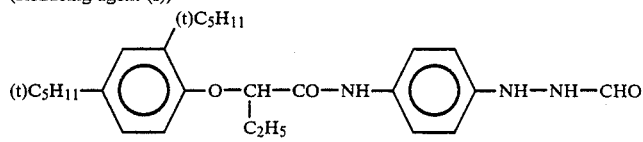

(Reducing agent (II))

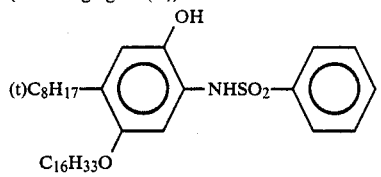

(Antifogging agent)

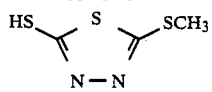

To 2.0 g of the silver halide emulsion were added 0.46 g 10% aqueous solution of potassium bromide and 0.3 g of 0.3% methanol solution of the following sensitizing dye, and the mixture was stirred for 5 minutes. To the above-prepared uniform solution was added the obtained mixture containing the silver halide emulsion. The resulting mixture was heated at 40° C., and stirred at 15,000 r.p.m. for 5 minutes to obtain a light-sensitive composition in the form of a W/O emulsion.

(Sensitizing dye)

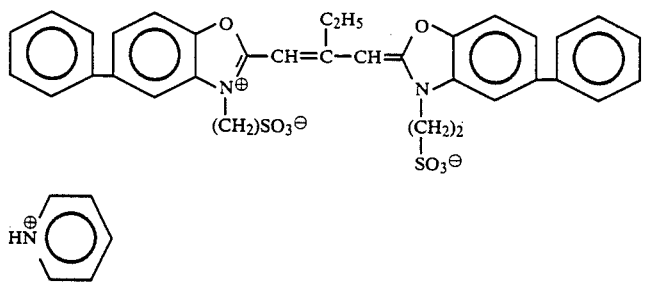

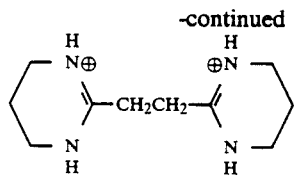

Preparation of light-sensitive microcapsule

Using 20% aqueous solution of phosphoric acid, 10% aqueous solution of a partial sodium salt of polyvinylbenzene sulfonic acid (tradename VERSA TL 500 produced by National Starch, Co.) was adjusted to pH of 3.5. To the W/O emulsion was added 0.90 g of an adduct of xylylene diisocyanate and trimethylolpropane (Takenate 110N produced by Takeda Chemical Industries, Ltd.), and the resulting W/O emulsion was added to the aqueous solution of the partial sodium salt of polyvinylbenzene sulfonic acid. The resulting mixture was stirred at 7,000 r.p.m. for 30 minutes using homogenizer at 40° C. to obtain W/O/W emulsion.

Separately, to 13.20 g of melamine were added 21.6 g of 37% aqueous solution of formaldehyde and 70.8 g of distilled water, and the mixture was stirred for 30 minutes at 60° C. to give a transparent melamineformaldehyde precondensate.

To 13.00 g of the precondensate was added the W/O/W emulsion. The mixture was then adjusted to pH 6.5 using 20% aqueous solution of phosphoric acid, and then was stirred for 120 minutes at 50° C. Further, the resulting mixture was adjusted to pH 7.0 using 1N aqueous solution of sodium hydroxyde to obtain a dispersion containing a light-sensitive microcapsule having a shell material comprising melamine-formaldehyde resin.

Preparation of light-sensitive material

To 2.50 g of the microcapsule dispersion were added 0.33 g of 5% aqueous solution of Emulex NP-8 (tradename of Nippon Emulsion Co., Ltd.), 0.83 g of 20% aqueous dispersion of corn starch and 3.19 g of distilled water, and the mixture was stirred to obtain a coating solution. The coating solution was coated on a polyethylene terephthalate film having a thickness of 100 μm using a wire bar of # 40 to give a layer having wet thickness of 70 μm and dried for 1 hour at 40° C. to obtain a light-sensitive material (A).

EXAMPLE 2

A light-sensitive material (B) was prepared in the same manner as in Example 1, except that 33.3 g of the following base precursor (5) was used in place of 33.3 g of the base precursor (3).

(Base precursor (5))

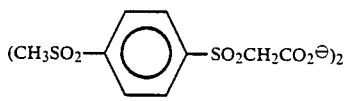

-continued

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was coated on a baryta paper having basis weight of 43 g/m² to give a layer having wet thickness of 30 μm and dried dried to obtain an image-receiving material.

Evaluation of light-sensitive material

Each of the light-sensitive materials prepared in Examples 1 and 2 was left at 25° C. in the humidity of 60%. After 12 hours, each of the light-sensitive materials was imagewise exposed to light using a tungsten lamp at 2,000 lux for 1 second through a filter in which the density was continuously changing from 0 to 3.0, and then heated on a hot plate at 140° C. for 40 seconds. Each of the exposed and heated light-sensitive materials was then combined with the image-receiving material and passed through press rolls at pressure of 400 kg/cm². The density of the obtained magenta positive image on the image-receiving material was measured using Macbeth's reflection densitometer.

Separately, each of the light-sensitive materials was left at 40° C. in the humidity of 5%. The image was formed on the image-receiving material in the same manner as described above. The density of the obtained magenta positive image on the image-receiving material was measured using Macbeth's reflection densitometer.

The results are set forth in Table 1. In table 1, "Dmax" means the maximum density and "Dmin" means the minimum density.

TABLE 1

| Light-sensitive Material | Base Precursor | Temperature 25° C. $D_{max}$ | Humidity 60% $D_{min}$ | Temperature 40° C. $D_{max}$ | Humidity 5% $D_{min}$ |
|---|---|---|---|---|---|
| (A) | (3) | 1.05 | 0.17 | 1.00 | 0.20 |

TABLE 1-continued

| Light-sensitive Material | Base Precursor | Temperature 25° C. $D_{max}$ | Humidity 60% $D_{min}$ | Temperature 40° C. $D_{max}$ | Humidity 5% $D_{min}$ |
|---|---|---|---|---|---|
| (B) | (5) | 1.07 | 0.18 | 1.10 | 0.21 |

It is apparent from the results in Table 1, the light-sensitive materials of the present invention can give a clear image having a high maximum density and a low minimum density, even after they are stored under severe conditions.

We claim:

1. A light-sensitive material comprising a support and a light-sensitive layer containing silver halide, a reducing agent, an ethylenic unsaturated polymerizable compound and a base precursor in the form of a salt of an organic base with a carboxylic acid, said silver halide, reducing agent and polymerizable compound being contained in microcapsules which are dispersed in the light-sensitive layer, wherein the base precursor is contained in the microcapsules, and the organic base of the base precursor is a diacidic to tetraacidic base which is composed of two to four amidine moieties and at least one residue of a hydrocarbon or a heterocyclic ring as a linking group for the amidine moieties, said amidine moiety corresponding to an atomic group formed by removing one or two hydrogen atoms from an amidine having the following formula (I):

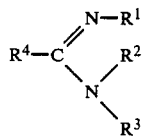
(I)

wherein each of $R^1$, $R^2$, $R^3$ and $R^4$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^1$, $R^2$, $R^3$ and $R^4$ may be combined together to form a five-membered or six-membered heterocyclic ring consisting of nitrogen and carbon atoms.

2. The light-sensitive material as claimed in claim 1, wherein the organic base is a diacidic to tetraacidic base having the following formula (II):

(II)

wherein $R^5$ is an n-valent residue of a hydrocarbon or a heterocyclic ring; B is a monovalent group corresponding to an atomic group formed by removing one hydrogen atom from an amidine having the formula (I); and "n" is 2, 3 or 4.

3. The light-sensitive material as claimed in claim 1, wherein the amidine having the formula (I) is a cyclic amidine having the following formula (I-2):

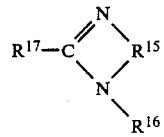
(I-2)

wherein $R^{15}$ is a divalent group selected from the group consisting of ethylene, propylene, vinylene and propenylene, each of which may have one or more substituent groups; and each of $R^{16}$ and $R^{17}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups.

4. The light-sensitive material as claimed in claim 1, wherein the amidine having the formula (I) is 1,4,5,6-tetrahydropyrimidine, which may have one or more substituent groups.

5. The light-sensitive material as claimed in claim 2, wherein the organic base having the formula (II) has a symmetrical chemical structure.

6. The light-sensitive material as claimed in claim 2, wherein "n" in the formula (II) is 2.

7. The light-sensitive material as claimed in claim 1, wherein the organic base is a diacidic to tetraacidic base having the following formula (II-1):

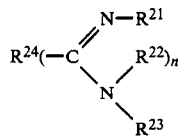
(II-1)

wherein each of $R^{21}$, $R^{22}$ and $R^{23}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{21}$, $R^{22}$ and $R^{23}$ may be combined together to form a five-membered or six-membered heterocyclic ring consisting of nitrogen and carbon atoms; $R^{24}$ is an n-valent residue of a hydrocarbon carbon or heterocyclic ring; and "n" is 2, 3 or 4.

8. The light-sensitive material as claimed in claim 1, wherein the organic base is a diacidic to tetraacidic base having the following formula (II-2):

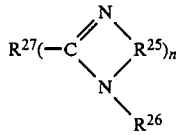
(II-2)

wherein $R^{25}$ is a divalent group selected from the group consisting of ethylene, propylene, vinylene and propenylene, each of which may have one or more substituent groups; $R^{26}$ is a monovalent group selected form the group consisting of hydrogen, an alkyl group, an alkenyl group an alkynyl group, a cycloalkyl group, an aralkyl group, an aryl group and a heterocyclic group, each of which may have one or more substituent groups; $R^{27}$ is an n-valent residue of a hydrocarbon or a heterocyclic ring; and "n" is 2, 3 or 4.

9. The light-sensitive material as claimed in claim 1, wherein the carboxylic acid has such a property that the carboxyl group of the carboxylic acid undergoes decarboxylation at an elevated temperature of 50° to 200° C.

10. The light-sensitive material as claimed in claim 1, wherein the carboxylic acid has an aryl group or an arylene group.

11. The light-sensitive material as claimed in claim 1, wherein the carboxylic acid has the following formula (III-1):

wherein each of $R^{31}$ and $R^{32}$ independently is a monovalent group selected from the group consisting of hydrogen, an alkyl group, an alkenyl group, a cycloalkyl group, an aralkyl group, an aryl group and a heterocyclic group, each of which may have one or more substituent groups; "k" is 1 or 2; when "k" is 1, Y is a monovalent group selected from the group consisting of an alkyl group, a cycloalkyl group, an alkenyl group, an alkynyl group, an aralkyl group, an aryl group and a heterocyclic group, each of which may have one or more substituent groups; and when "k" is 2, Y is a divalent group selected from the group consisting of an alkylene group, an arylene group and a heterocyclic group, each of which may have one or more substituent groups.

12. The light-sensitive material as claimed in claim 1, wherein the salt of the organic base with the carboxylic acid has a melting point of 50° to 200° C.

13. The light-sensitive material as claimed in claim 1, wherein the base precursor is dispersed in the microcapsules in the form of solid particles.

14. The light-sensitive material as claimed in claim 1, wherein the base precursor is contained in the light-sensitive layer in the amount of 0.01 to 40 weight % based on the total amount of the light-sensitive layer.

15. The light-sensitive material as claimed in claim 1, wherein the light-sensitive layer contains a color image forming substance, said color image forming substance being contained in the microcapsules.

* * * * *